United States Patent [19]

Sato et al.

[11] Patent Number: 4,888,269
[45] Date of Patent: Dec. 19, 1989

[54] RESIN COMPOSITION FOR SOLDER RESIST INK

[75] Inventors: Yoneji Sato; Masato Hoshino, both of Hachioji; Seiichi Kitazawa, Ichihara; Tadashi Yasuda, Chiba, all of Japan

[73] Assignees: Dainippon Ink & Chemicals, Inc.; Asahi Chemical Research Laboratory, Ltd., both of Tokyo, Japan

[21] Appl. No.: 231,606

[22] Filed: Aug. 11, 1988

Related U.S. Application Data

[63] Continuation of Ser. No. 882,407, Jul. 7, 1986, abandoned, which is a continuation-in-part of Ser. No. 778,794, Sep. 23, 1985, abandoned.

[30] Foreign Application Priority Data

Jun. 29, 1985 [JP] Japan .................. 60-143,268
Jun. 29, 1985 [JP] Japan .................. 60-143,269
Jul. 4, 1985 [JP] Japan .................. 60-145,778
Jul. 4, 1985 [JP] Japan .................. 60-145,779

[51] Int. Cl.$^4$ .............................. G03C 1/68
[52] U.S. Cl. ................... 430/280; 430/288; 430/284; 522/100; 522/92; 522/103
[58] Field of Search .......... 430/280, 288, 284; 522/100, 92, 103

[56] References Cited

U.S. PATENT DOCUMENTS

| | | | |
|---|---|---|---|
| 3,551,246 | 12/1970 | Bassemir et al. | 156/272 |
| 3,753,720 | 8/1973 | Kloczewski et al. | 96/115 |
| 3,932,401 | 1/1976 | Berg et al. | 260/248 |
| 3,989,610 | 11/1976 | Tsukada et al. | 430/280 |
| 4,169,732 | 10/1979 | Shipley | 204/159.15 X |
| 4,237,216 | 12/1980 | Skarvinko | 522/103 X |
| 4,390,615 | 6/1983 | Courtney et al. | 430/315 |
| 4,479,983 | 10/1984 | Appelt et al. | 427/54.1 |
| 4,510,593 | 4/1985 | Daniels | 369/283 |
| 4,530,746 | 7/1985 | Azuma et al. | 204/159.13 |
| 4,544,623 | 10/1985 | Audykowski et al. | 430/280 |
| 4,555,532 | 11/1985 | Tanaka et al. | 523/400 |
| 4,702,997 | 10/1987 | Ai et al. | 430/325 |

FOREIGN PATENT DOCUMENTS 2032939 5/1980 United Kingdom .

Primary Examiner—Charles L. Bowers Jr.
Assistant Examiner—Cynthia Hamilton
Attorney, Agent, or Firm—Sherman & Shalloway

[57] ABSTRACT

A resin composition for use in a solder resist ink, said composition comprising as essential ingredients
(A) an epoxy vinyl ester resin solution obtained by dissolving (A-a) an epoxy vinyl ester resin obtained by reacting a phenol novolak-type epoxy resin and/or a cresol novolak-type epoxy resin with 0.40 to 0.85 mol, per epoxy group of the epoxy resin, of an unsaturated monobasic acid in (A-b) an organic and/or (A-c) at least one photopolymerizable polyfunctional vinyl monomer selected from the group consisting trifunctional or higher polyoxyalkylene glycol poly(meth)acrylates, poly(meth)acrylates of polyoxyalkyl isocyanurates and poly(meth)acrylates of acetal compounds,
(B) a photopolymerization initiator, and
(C) a curing agent of an amino group and/or imino group-containing epoxy resin.

13 Claims, No Drawings

RESIN COMPOSITION FOR SOLDER RESIST INK

This is a continuation of Ser. No. 882,407, filed 7/7/86, which is a continuation-in-part application of Ser. No. 778,794 filed on September 23, 1985.

This invention relates to a new and useful resin composition for use in solder resist ink. More specifically, it relates to a resin composition having excellent heat resistance and dielectric resistance properties for use in printed wiring circuit boards, comprising a vinyl ester resin derived from a specific epoxy resin, a photopolymerization initiator and a curing agent of an amino group and/or imino group-containing epoxy resin.

The present invention provides a resin composition for a liquid photographic image-type solder mask ink. This solder mask ink is used in place of a conventional dry film developing-type solder resist ink to form a resist pattern by coating the liquid photo resist ink on the entire surface of a printed wiring circuit board, exposing the coated film to the irradiation of active energy light through a photomask and then developing the exposed film.

The solder resist ink is required to have dielectric resistance, heat resistance, adhesion, chemical resistance, screen printability, etc. to avoid its adhesion to unwanted parts and protect the circuit on the printed wiring circuit board in the soldering of parts to the printed circuit board.

Early in the development of this technology, heat-curable solder resist inks of the melamine resin type were used. Later, heat-curable solder resist inks of the epoxy resin type having superior heat resistance, hardness, adhesion, chemical resistance, etc. were developed and have gained widespread use in printed wiring circuit boards of industrial appliances such a computers that require high reliability.

On the other hand, since solder resist inks used in printed circuit boards of household appliances require handlability and productivity, ultraviolet-curable solder resist inks based on acrylated epoxy resins or urethane resins have gained widespread acceptance in place of the heat-curable solder resist inks of the epoxy resin type. As is well known, the ultraviolet-curable solder resists are cured by radical reaction induced by the irradiation of ultraviolet light. When a film of the coated resist is thick, curing of its interior is slow. Particularly, in the case of printed circuit boards of industrial appliances, the thickness of conductors is as large as at least 70 micrometers when it is copper-plated or Sn/Pb-plated, the solder resist to be coated on it necessarily has a thickness of at least 50 micrometers in part. Accordingly, parts not irradiated with ultraviolet light, for example, the underside of the edge of the circuit, are not completely cured, and are liable to have low dielectric resistance and permit electro-migration. To prevent such troubles, therefore, it is necessary to adjust the thickness of the resist film to less than 20 micrometers by decreasing the mesh size of the screen and reducing the thickness of the emulsion film. For this reason, the use of the ultraviolet light-curable solder resist inks has been limited to copper conductors in general household appliances on which they may be coated to a thickness of about 35 micrometers. With the recent trend toward size reduction, improved function, material saving, cost curtailment, etc. in the production of electronics devices, the industrial printed circuit boards have also required increased precision in the pattern density of the circuit. Previously, the pattern density was two lines between IC pads, but now 3 to 5 lines between IC pads are desired. With the screen printing process using the existing solder resist inks of the epoxy resin type or ultraviolet light-curable solder resist inks, the dimensional accuracy of the circuit pattern is low because of a limited printing resolution attainable and the stretching of the screen, and no satisfactory results have been obtained.

The ultraviolet light-curable solder resist ink used in the screen printing process contains mono- to tri-functional monomers such as 2-hydroxyethyl acrylate and trimethylolpropane triacrylate and various acrylate oligomers. These substances migrate during the screen printing, and bring about the serious defect that when such a solder resist ink is used, for example, in a printed wiring circuit board having a pattern density of at least 2 lines between IC pads, soldering cannot be well effected. To prevent this situation, it has been the practice to increase photo resolution by reducing the thickness of the coated film. By such a method, however, the solder resist ink is not uniformly coated on the circuit, and the dielectric resistance of the coated film is reduced. The inherent action of the solder resist ink is consequently nullified.

Recently, a photographic process using a dry film was developed in order to increase photo resolution. This process can certainly give increased resolution, but the covering property of the dry film between circuits is poor and problems such as the formation of blisters of the coated film or poor film adhesion exist.

In an attempt to improve the covering property of the dry film between circuits, the development of a liquid photographic image-type solder resist ink has been under way. For example, U.S. Pat. No. 4,390,615 discloses a photopolymerizable resin composition comprising a vinyl ester resin obtained by the reaction of nearly equal equivalents of a polyepoxide and an ethylenically unsaturated carboxylic acid, an inert inorganic filler, a photopolymerization initiator and a volatile organic solvent. This photopolymerizable resin composition has good covering property between circuits of a printed circuit board. But since the vinyl ester resin has hardly any epoxide group in the molecule, if a vinyl ester resin obtained by reacting nearly equal equivalents of a phenol novolak-type epoxy resin or a cresol novolak-type epoxy resin with an unsaturated monobasic acid is used in order to increase heat resistance, the resin composition has a poor adhesion to a substrate or low dielectric resistance. Furthermore, if a bisphenol-type epoxy vinyl ester resin is used in order to increase the adhesion to the substrate, the heat resistance or solvent resistance of the resulting composition is poor. Thus, the composition disclosed in the above-cited U.S. Patent is not satisfactory.

In an attempt to improve the adhesion of the photopolymerizable resin composition disclosed in U.S. Pat. No. 4,390,615 to a substrate, one may conceive the preparation of a photopolymerizable resin composition comprising a vinyl ester resin obtained by the reaction of nearly equal equivalents of a polyepoxide and an ethylenically unsaturated carboxylic acid, a photopolymerization initiator, an epoxy resin, a curing agent for the epoxy resin, and a volatile organic solvent. However, when this resin composition is used as a solder resist ink and a resist pattern is formed by exposing a coated film of the ink to active energy light through a photomask and then developing the exposed film, the epoxy resin in the resist ink remains unreacted in the exposed film because the epoxy resin itself is not curable under active energy light. As a result, when the unexposed portions are removed by a solvent such as trichloroethylene, the epoxy resin present in the exposed film is simultaneously dissolved, and a satisfactory coated film cannot be obtained. Hence, the resulting resist pattern is not sharp, and the coated film is markedly reduced in adhesion to a substrate and in heat resistance. Consequently, it is impossible to obtain a solder resist ink of the photographic image type contemplated by the present invention.

European Pat. No. 75537 discloses a resin composition for use in a solder resist ink, comprising a photosensitive epoxy resin composition obtained by the reaction of an epoxy resin with a chalcone group-containing compound such as 4,4'-dihydroxydistyrylketone, bis-(p-hydroxy-benzoinyl vinyl)phenylene or p-hydroxyphenyl-p-hydroxystyrylketone, a curing agent therefor, an organic solvent and a filler. This composition also has the disadvantage of causing reduced dielectric resistance, shortcircuiting of a circuit owing to poor soldering, which are attributed to the whitening of the coated film during coating and the formation of small blisters on the coated film during heat curing of the coated film after exposure to active energy light.

The present inventors have made extensive investigations in view of the various problems in the prior art described above, and have now found that a solder resist ink having superior heat resistance, adhesion, chemical resistance and dielectric resistance can be obtained by using a specific epoxy vinyl ester resin which can be photopolymerized and is curable under heat in the presence of an amine.

According to this invention, there is provided a resin composition for use in a solder resist ink having excellent heat resistance and resolution in particular, said composition comprising (A) an epoxy vinyl ester resin solution obtained by dissolving (A-a) an epoxy vinyl ester resin obtained by the reaction of a phenol novolak-type epoxy resin and/or a cresol novolak-type epoxy resin with 0.40 to 0.85 mol, per epoxy group of the epoxy resin, of an unsaturated monobasic acid in (A-b) an organic solvent and/or (A-c) at least one photopolymerizable polyfunctional vinyl monomer selected from the group consisting of trifunctional or higher polyoxyalkylene glycol poly(meth)acrylates, poly(meth)acrylates of polyoxyalkyl isocyanurates and poly(meth)acrylates of acetal compounds, (B) a photopolymerization initiator, and (C) a curing agent of an amino group and/or imino group-containing epoxy resin (hereinafter called an "amine-type curing agent").

The phenol novolak-type epoxy resin used in this invention denotes a resin which is obtained by reacting a so-called phenol novolak resin derived from phenol and formaldehyde with epichlorohydrin or methylepichlorohydrin. The cresol novolak-type epoxy resin denotes a resin which is obtained by reacting a so-called cresol novolak resin derived from cresol and formaldehyde with epichlorohydrin or methylepichlorohydrin. Among these, resins having a melting point of 60° to 120° C., preferably 70° to 100° C. are most preferable because the surface after coating and drying the solder resist ink becomes tack-free and the handlability in the subsequent operation is excellent.

Typical examples of the unsaturated monobasic acid to be reacted with these novolak-type epoxy resins include acrylic acid, methacrylic acid, crotonic acid, monomethyl maleate, monopropyl maleate, monobutyl maleate, sorbic acid, and mono(2-ethylhexyl) maleate. They may be used either singly or in combination.

The epoxy vinyl ester resin (A-a) can be obtained by reacting the phenol novolak-type epoxy resin and/or cresol novolak-type epoxy resin with the unsaturated monobasic acid in the presence of an esterification catalyst at a temperature of usually 60° to 140° C., preferably 80° to 120° C. In this reaction, the unsaturated monobasic acid is suitably used in a proportion of 0.40 to 0.85 mol per epoxy group of the novolak-type epoxy resin.

Preferably, the resulting phenol novolak-type epoxy resin or cresol novolak-type epoxy resin is of such a type that the unsaturated monobasic acid adds to some of the epoxy groups and both the epoxy groups and the vinyl groups exist together in one molecule.

The esterification catalyst may be selected from known conventional esterification catalysts. Typical examples include tertiary amines such as triethylamine, N,N-dimethylbenzylamine, N,N-dimethylaniline or diazabicyclooctane, diethylamine hydrochloride, dimethylamine acetate and dimethylamine nitrate.

The amount of these esterification catalysts is 0.001 to 1.0 part by weight per 100 parts by weight of the total amount of the epoxy resin and the unsaturated monobasic acid. Certain of these esterification catalysts are also available as a curing agent of the epoxy resin. Therefore, if the esterification catalysts are used in amounts exceeding the above range, the curing reaction of the epoxy resin occurs as a side reaction in addition to the esterification reaction of the epoxy resin and the unsaturated monobasic acid, thereby allowing gelation. Consequently it is hard to obtain the epoxy vinyl ester resin (A-a) having both the epoxy group and the vinyl group in one molecule as aimed at by this invention.

In the preparation of the vinyl ester resin (A-a), the use of a polymerization inhibitor is recommended in order to prevent gellation or to adjust the storage stability or curability of the resulting resin.

Typical examples of the polymerization inhibitor include hydroquinones such as hydroquinone, p-tert-butyl-catechol or mono-tert-butyl hydroquinone; phenols such as hydroquinone monomethyl ether or di-tert-butyl-p-cresol; quinones such as p-benzoquinone, naphthoquinone and p-toluquinone; and copper salts such as copper naphthenate.

The resulting vinyl ester resin (A-2) is then dissolved in the specific organic solvent (A-b) and/or the photopolymerizable polyfunctional vinyl monomer (A-c) to form a stable resin solution. Typical examples of the organic solvent (A-b) include aromatic hydrocarbons such as toluene or xylene; alcohols such as methanol or isopropanol; esters such as ethyl acetate or butyl acetate; ethers such as 1,4-dioxane or tetrahydrofuran; ketones such as methyl ethyl ketone or methyl isobutyl ketone; glycol derivatives such as Cellosolve (diethylene glycol, a trademark for a product of UCC), butyl Cellosolve (ethylene glycol monobutyl ether, a trademark for a product of UCC), ethyl Cellosolve (ethylene glycol monoethyl ether, a trademark for a product of UCC) or methyl Cellosolve (ethylene glycol monomethyl ether, a trademark for a product of UCC); alicyclic hydrocarbons such as cyclohexanone or cyclohexanol; and petroleum-type solvents such as petroleum naphtha. These solvents may be used singly or in combination. The amount of the organic solvent (A-b) is not particularly restricted, but from the standpoint of handlability, its suitable amount is in the range of 5 to 60% by weight, preferably 10° to 40°% by weight, based on the epoxy vinyl ester resin (A-a).

Examples of suitable photopolymerizable vinyl monomers (A-c) from the viewpoint of photocurability or heat resistance include trifunctional or higher polyoxyalkylene glycol poly(meth)acrylates, typified by a tri-, tetra-, penta- or hexa-(meth)acrylate of dipentaerythritol, a tri-, tetra-, penta- or hexa-(meth)acrylate of a caprolactone adduct of dipentaerythritol, a tri(meth)acrylate of a propylene oxide adduct of glycerol, a tri-(meth)acrylate of a propylene oxide adduct of trimethylolpropane, or tri- to penta-functional monomers obtained by reacting dipentaerythritol with lower fatty acids having 1 to 4 carbon atoms and (meth)acryllic acid; poly(meth)-acrylates of polyoxyalkyl isocyanurates typified by bis-[(meth)acrloyloxyethyl]hydroxyethyl isocyanurate or tris-[(meth)acryloyloxyethyl-]isocyanurate; and poly(meth)-acrylates of acetal compounds typified by 2-(2-hydroxy-1,1-dimethylethyl)-5-hydroxymethyl-5-ethyl-1,3-dioxane diacrylate. These monomers may be used singly or in combination.

The amount of the polyfunctional vinyl monomer (A-c) is not particularly restricted, but from the viewpoint of handlability, its suitable amount is in the range of 5° to 60°% by weight, preferably 10° to 40°% by weight, based on the epoxy vinyl ester resin (A-2).

Typical examples of the photopolymerizable initiator (B) are carbonyl compounds such as p-tert-butyl-trichloroacetophenone, 2,2-diethoxyacetophenone, benzophenone, 4,4-bismethylaminobenzophenone, benzil, benzoin, benzoin methyl ether, benzoin isobutyl ether, benzil methyl ketal, methyl-o-benzoylbenzoate and alpha-hydroxyisobutylphenone; sulfur compounds such as tramethylthiuram monosulfide, thioxanthone and 2-chlorothioxanthone; azo compounds such as azobisisovaleronitrile; and anthraquinones such as 2-ethylanthraquinone. These compounds may be used sin9ly or in combination. The suitable amount of the initiator (B) is in the range of 0.1 to 20 parts by weight per 100 parts by weight of the epoxy vinyl ester resin solution (A).

Typical examples of the amine-type curing agent (C) include aliphatic polyamines such as ethylenediamine, diethylenetriamine, triethylenetetramine, diethylaminopropylamine and xylylenediamine; aromatic polyamines such as m-phenylenediamine, diaminodiphenylmethane and diamino-diphenylsulfone; alicyclic polyamines such as menthane-diamine, isophoronediamine and bis(4-amino-3-methylcyclohexyl)methane; dicyandiamide; imidazoles such as 2-methyl-imidazole, 2-ethyl-4-methylimidazole and 1-benzyl-2-methylimidazole; tertiary amines such as benzyl dimethylamine, tridimethylaminomethylphenol and dimethylaminomethyl phenol; and amine complexes such as BF$_3$-monoethylamine.

Among these, curing agents which have low reactivity at room temperature but can react abruptly when heated are preferred in order to obtain a resist ink having good handlability and a long pot life. The use of the aromatic polyamines, imidazoles, tertiary amines and dicyandiamide is especially preferred.

The amount of the amine-type curing agent (C) is in such range that the number of active hydrogen in the amine-type curing agent (C) is 0.4 to 1.5, preferably 0.6 to 1.2 per remaining epoxy group of the epoxy vinyl ester resin (A-a). However, where the amine-type curing agent (C) is dicyanediamine, tertiary amines, imidazoles and/or amine complex compounds, the amount of said amine-type curing agent is 2 to 30 parts by weight, preferably 3 to 20 parts by weight per 100 parts by weight of the epoxy vinyl ester resin (A-a).

When the amount of the amine-type curing agent (C) is larger than the above range, the solder resistance undesirously decreases. When said amount is less than the above range curing becomes insufficient and the solder resistance decreases. It is thus undesirous. On this occasion the curing can be fully carried out at high temperatures, but dimensional change of the printed wiring board and oxidation of a circuit conductor occur and electrical characteristics decrease. It is therefore also undesirous.

The above amine-type curing agent (C) includes the same compounds as the esterification catalyst. However, regarding the same compounds, the amount as the esterification catalyst is at most one-fifth that as the curing agent. The amount of the compound as the esterification catalyst cannot give a fully cured composition having excellent solder resistance.

In order to improve the various properties of the solder resist ink, the resin composition of this invention may further contain a filler such as silica, talc or clay, a thixotropic agent such as Aerosil, a defoamer or a levelling agent of the silicon or fluorine-type, a coloring agent, etc.

The resulting resin composition for use in a solder resist ink in accordance with the present invention is coated on the entire surface of a printed circuit board by known conventional methods, for example by screen printing, roll coating or curtain coating.

When the composition of this invention contains the organic solvent (A-b), it is desirable to render the ink-coated surface tack-free by removing the solvent after a solder resist ink from the composition has been coated and pre-dried. A photomask is brought into intimate contact with the ink-coated surface kept tack-free, and active energy light is irradiated on it to insolubilize the ink by radical polymerization. If the ink surface is not rendered tack-free, a method may be employed in which the photomask is not kept in intimate contact with the ink-coated surface, but the photomask is held on a transparent support, parallel rays of active energy light are irradiated.

Those parts which have not been exposed to active energy light are removed by washing with a developing solvent such as trichloroethylene, perchloroethylene, methylene chloride, or alkaline water. Thereafter, the epoxy groups present in the epoxy vinyl ester resin (A-a) are reacted by heating to form a cured resist pattern.

The following Referential Examples, Examples and Comparative Examples specifically illustrate the present invention. Unless otherwise specified, all parts and percentages are by weight.

REFERENTIAL EXAMPLE 1

Preparation of an epoxy vinyl ester resin for comparison:

A three-necked flask equipped with a thermometer, a stirrer and a condenser tube was charged with 1,800 parts (corresponding to 10 epoxy groups) of "Epiclon N-740" (a tradename for a phenol novolak-type epoxy resin produced by Dainippon Ink & Chemicals, Inc.;

epoxy equivalent=180), 720 parts (corresponding to 10 carboxyl groups) of acrylic acid, 1.26 parts of hydroquinone and 10.1 parts of triethylamine, and the flask was heated to 110° C. The mixture was maintained at this temperature for 6 hours to give a resin having an acid value of 2.0 and an epoxy equivalent of more than 20,000. The resulting resin is designated as resin (A'-1).

REFERENTIAL EXAMPLES 2-4

Preparation of epoxy vinyl ester resins (A-2):

Referential Example 1 was repeated except that the proportions of "Epiclon N-740", acrylic acid, hydroquinone and triethylamine used were changed as shown in Table 1.

The epoxy equivalents and acid values of the resulting resins (A-a-2) to (A-a-4) are summarized in Table 1.

TABLE 1

| | Referential Example | | | |
|---|---|---|---|---|
| | 1 | 2 | 3 | 4 |
| Proportion (parts) | | | | |
| Epiclon N-740 | | 1,800 | | |
| Acrylic acid | 720 | 576 | 432 | 288 |
| Hydroquinone | 1.26 | 1.19 | 1.12 | 1.04 |
| Triethylamine | 10.1 | 9.50 | 8.93 | 8.35 |
| Epoxy groups/ carboxyl groups | 10/10 | 10/8 | 10/6 | 10/4 |
| Properties | | | | |
| Acid value | 2.0 | 2.5 | 1.5 | 1.5 |
| Epoxy equivalent | >20,000 | 1,190 | 560 | 350 |
| Resin designation | A'-1 | A-a-1 | A-a-2 | A-a-3 |

REFERENTIAL EXAMPLES 5-6

Preparation of epoxy vinyl ester resins (A-2):

Referential Example 1 was repeated except that the proportions of "Epiclon N-660"( a tradename for a cresol novolak-type epoxy resin manufactured by Dainippon Ink & Chemicals, Inc.; epoxy equivalent=220) was used instead of "Epiclon N-740", and the proportions of acrylic acid hydroquinone and triethylamine were changed as shown in Table 2.

TABLE 2

| | Referential-Example | |
|---|---|---|
| | 5 | 6 |
| Proportion (parts) | | |
| "Epiclon N-660" | | 2,200 |
| Acrylic acid | 504 | 360 |
| Hydroquinone | 1.35 | 1.28 |
| Triethylamine | 10.8 | 10.2 |
| Epoxy groups/ carboxyl groups | 10/7 | 10/5 |
| Properties | | |
| Acid value | 3.0 | 2.0 |
| Epoxy equivalent | 900 | 510 |
| Resin designation | A-a-4 | A-a-5 |

REFERENTIAL EXAMPLES 7-8

Preparation of epoxy vinyl ester resins for comparison:

Referential Example 1 was repeated except that "Epiclon 850" (a tradename for a bisphenol A-type epoxy resin manufactured by Dainippon Ink & Chemicals, Inc.; epoxy equivalent=185) or "Epiclon 1050" (a tradename for a bisphenol A-type epoxy resin manufactured by Dainippon Ink & Chemicals, Inc.; epoxy equivalent=470) was used instead of "Epiclon N-740", and the proportions of acrylic acid, hydroquinone and triethylamine used were changed as shown in Table 3. The properties of the resulting resins as shown in Table 3.

TABLE 3

| | Referential Example | |
|---|---|---|
| | 7 | 8 |
| Proportion (parts) | | |
| "Epicolon 850" | 1,850 | — |
| "Epiclon 1050" | — | 4,700 |
| Acrylic acid | | 504 |
| Hydroquinone | 1.18 | 2.60 |
| Triethylamine | 9.42 | 20.82 |
| Epoxy groups/ carboxyl groups | | 10/7 |
| Properties | | |
| Acid value | 3.5 | 1.0 |
| Epoxy equivalent | 790 | 1,740 |
| Resin designation | A'-2 | A'-3 |

EXAMPLES 1-8 AND COMPARATIVE EXAMPLES 1-5

In each run, each of the epoxy vinyl ester resins or epoxy resins obtained in Referential Examples 1 to 8 was mixed with an organic solvent or a photopolymerizable polyfunctional vinyl monomer, a photopolymerization initiator, and an amine-type curing agent in the proportions indicated in Table 4 to prepare a solder resist ink. The ink was coated to a film thickness of 30 to 40 micrometers on a copper through-hole printed wiring board by screen printing.

The coated film was dried at 130° C. for 5 minutes as required, and exposed to the irradiation of ultraviolet light having an illuminance of 20 mw/cm$^2$ and a wavelength in the vicinity of 350 nm for 60 seconds through a photomask using a 5 KW ultrahigh voltage mercury lamp. Then, the non-irradiated parts of the coated film were removed by washing it with an organic solvent such as trichloroethylene.

The wiring board was then heated for 30 minutes at 130° C. using a hot air dryer. The resulting samples were subjected to the various tests described below.

The results are summarized in Table 4.

The various properties were evaluated by the following methods.

Solvent Resistance

Ultraviolet light having a wavelength in the vicinity of 350 nm and an illuminance of 20 mw/cm$^2$ was irradiated on above coated film for 60 seconds using a 5KW ultrahigh voltage mercury lamp. Then, the unirradiated parts were removed by using trichloroethylene, and the state of the coated film at the irradiated parts was observed. Its solvent resistance was evaluated on the following scale.

◯ . . . No change in the appearance of the coated film
X . . . Dissolved or swollen Solder Resistance The sample was immersed for 2 minutes in molten solder (composed of 60% of tin and 40% of lead) at 260° C., and the state of the coated film was observed. Its solder resistance was evaluated on the following scale.

◯ . . . No change in the appearance of the coated film
X . . . Blisters occurred, or the film was melted, and/or peeled.

Cross-Cut Test

One hundred crosscuts having a size of 1 ×1 mm were formed on the coated film of the sample. A cellophane tape was applied to the cut surface and then peeled. The number of the remaining crosscuts was determined and defined as adhesion. This test was in accordance with JIS D-0202.

Surface Dielectric Resistance

The sample resist ink was coated on a test mill pattern in accordance with IPC-840B-25 of the MIL specification, and the substrate was left to stand for 240 hours in an atmosphere kept at a temperature of 85° C. and a relative humidity of 95%. The surface dielectric resistance of the coated film was measured in accordance with JIS Z-3197.

The results shown in Table 4 clearly demonstrate that the coated films obtained by using the resin compositions of this invention had excellent heat resistance, adhesion, solvent resistance and dielectric resistance.

TABLE 4

| Blending proportions (parts) | | | Example | | | | | | | | Comparative Example | | | | |
|---|---|---|---|---|---|---|---|---|---|---|---|---|---|---|---|
| | | | 1 | 2 | 3 | 4 | 5 | 6 | 7 | 8 | 1 | 2 | 3 | 4 | 5 |
| Designations of the epoxy vinyl ester resin | A-a-1 | | 80 | | | | | | | | | | | | |
| | A-a-2 | | | 80 | | | | | | | | | | | |
| | A-a-3 | | | | 80 | | | | | | | | | | |
| | A-a-4 | | | | | 70 | | | | | | | | | |
| | A-a-5 | | | | | | 70 | | | | 80 | | | | |
| | A'-1 | | | | | | | 30 | | | | 70 | | | |
| | A'-2 | | | | | | | 40 | 35 | 50 | | | 70 | 35 | 35 |
| | A'-3 | | | | | | | | 35 | | | | | 35 | 35 |
| Epoxy resins | Epiclon N-740 | | 20 | 10 | 20 | 20 | 20 | 20 | 20 | 20 | | 10 | 20 | 10 | 10 |
| | Epiclon N-660 | | | | | | | | | | | | | | |
| Organic solvent (butyl Cellosolve) | | | | | | | | | | | | | 5 | | |
| Photopolymerizable polyfunctional vinyl monomer (*) | (a) | | 10 | | | | 20 | | | | | | | | |
| | (b) | | | 10 | 20 | 10 | 10 | 10 | 10 | 30 | | 10 | 10 | 10 | 10 |
| | (c) | | | | | | | | | | | | | | |
| Photopolymerization initiator (benzophenone) | | | | | | | 5 | | | | | | | | |
| Amine-type curing agent | Dicyandiamide | | 4 | 3 | 3 | 4 | 4 | 3 | 3 | 4 | | 4 | 4 | 4 | 4 |
| | 2-Ethyl-4-methyl-imidazole | | | | | | | | | | | | | | |
| Properties of the coated film | Solvent resistance | | | | | | ∞ | | | | | | | | |
| | Solder resistance | | | | | | 100/100 | | | | | 45/100 | | | | |
| | Cross-cut test | | | | | | | | | | | | | | Measurement impossible because no coated film could be obtained. |
| | Surface dielectric resistance (Ω) | | $3.0 \times 10^{12}$ | $4.0 \times 10^{12}$ | $2.0 \times 10^{12}$ | $4.5 \times 10^{12}$ | $5.0 \times 10^{12}$ | $3.5 \times 10^{12}$ | $5.5 \times 10^{12}$ | $2.5 \times 10^{12}$ | $3.5 \times 10^{9}$ | | | | |

(*): (a) = Dipentaerythritol hexaacrylate,
(b) = Tris (acryloyloxyethyl) isocyanurate
(c) = 2-(2-Hydroxy-1,1-dimethylethyl)-5-hydroxymethyl-5-ethyl-1,3-dioxanediacrylate

What is claimed is:

1. A resin composition for use in solder resist ink consisting essentially of:
    (A) 100 parts by weight of a solution obtained by dissolving (A-a) an epoxy vinyl resin in (A-b) an organic solvent or (A-c) at least one photopolymerizable polyfunctional vinyl monomer selected from the group consisting of trifunctional or higher polyoxyalkylene glycol poly(meth)acrylates, poly(meth)acrylates of polyoxyalkyl isocyanurates and poly(meth)acrylates of acetal compounds, wherein said epoxy vinyl ester resin (A-a) is obtained by reacting a phenol novolak-type epoxy resin or a cresol novolak-type epoxy resin with 0.40 to 0.80 mole, per epoxy group of the epoxy resin, of an unsaturated monobasic acid,
    (B) 0.1 to 20 parts by weight of a photopolymerization initiator, and
    (C) an amine-type curing agent in such a proportion that the number of active hydrogen in said curing agent (C) is 0.4 to 1.5 per remaining epoxy group of the epoxy vinyl ester resin (A-a), provided that when the curing agent (C) is dicyandiamine, a tertiary amine, an imidazole or an amine complex compound, the proportion of the curing agent (C) is 2 to 30 parts by weight per 100 parts by weight of the epoxy vinyl ester resin (A-a).

2. The composition of claim 1 wherein the epoxy vinyl ester resin is a phenol novolak-type epoxy resin having a melting point of 60° to 120° C. and obtained by reacting a phenol novolak resin obtained from phenol and formaldehyde with epichlorohydrin.

3. The composition of claim 1 wherein the epoxy vinyl ester resin is a cresol novolak-type epoxy resin having a melting point of 60° to 120° C. and obtained by reacting a cresol novolak resin obtained from cresol and formaldehyde with epichlorohydrin.

4. The composition of claim 1 wherein the epoxy vinyl ester resin (A-a) is an epoxy vinyl ester resin obtained by reacting a cresol novolak-type epoxy resin with 0.40 to 0.80 mol, per epoxy group of the epoxy resin, of an unsaturated monobasic acid.

5. The composition of claim 1 wherein the unsaturated monobasic acid is acrylic acid.

6. The composition of claim 1 or 4 wherein the organic solvent (A-b) is at least one solvent selected from the group consisting of ethylene glycol monobutyl ether, ethylene glycol monoethyl ether, ethylene glycol monomethyl ether, cyclohexane and petroleum naphtha.

7. The composition of claim 1 or 4 wherein the photopolymerization initiator (B) is selected from the group consisting of benzophenone, p-tert-butyltrichloroacetophenone, benzoin, benzyl methyl ketal, thioxanethone and 2-ethylanthraquinone.

8. The composition of claim 1 or 4 wherein the amine-type curing agent (C) is dicyandiamide.

9. The composition of claim 1 or 4 wherein the amine-type curing agent (C) is an imidazole.

10. The composition of claim 4 wherein the cresol novolak-type epoxy resin is a cresol novolak-type epoxy resin melting at a temperature of from 60° to 120° C.

11. The composition of claim 1 or 13 wherein the photopolymerizable polyfunctional vinyl monomer (A-c) is at least one photopolymerizable polyfunctional vinyl monomer selected from the group consisting of dipentaerythritol hexaacrylate, dipentaerythritol pentacrylate, tris(acyoyloxyethyl) isocyanaurate and 2-(2-hydroxy-1,1-dimethylethyl)-5-hydroxymethyl-5-ethyl--1,3-dioxane diacrylate.

12. The composition of claim 8 wherein the amount of the dicyandiamide is from 3 to 20 parts by weight per 100 parts by weight of the epoxy vinyl ester resin (A-a).

13. The composition of claim 9 wherein the imidazole is present in an amount of 3 to 20 parts by weight per 100 parts by weight of the epoxy vinyl ester resin (A-a).

* * * * *

UNITED STATES PATENT AND TRADEMARK OFFICE
CERTIFICATE OF CORRECTION

PATENT NO. : 4,888,269
DATED : December 19, 1989
INVENTOR(S) : YONEJI SATO ET AL.

It is certified that error appears in the above-identified patent and that said Letters Patent is hereby corrected as shown below:

On the cover page, in the Abstract, line 8 of the Abstract,
 after "organic", insert --solvent--;
  lines 10 and 11 of the Abstract, after "consisting", insert --of--.

Claim 1, line 4, after "vinyl", insert --ester--.

Claim 5, line 1 of the claim, "claim 1" should read --Claim 1 or 4--.

Claim 11, line 1 of the claim, "13" should read --4--; and
  line 6 of the claim, "isocyanaurate" should read --isocyanurate--; and
  lines 7 and 8 of the claim, "5-ethyl--1,3-dioxane" should read --5-ethyl-1,3-dioxane--.

Signed and Sealed this

Twenty-sixth Day of February, 1991

Attest:

HARRY F. MANBECK, JR.

*Attesting Officer*       *Commissioner of Patents and Trademarks*